(12) United States Patent
Nagarajan et al.

(10) Patent No.: US 6,320,127 B1
(45) Date of Patent: Nov. 20, 2001

(54) METHOD AND STRUCTURE FOR REDUCING THE INCIDENCE OF VOIDING IN AN UNDERFILL LAYER OF AN ELECTRONIC COMPONENT PACKAGE

(75) Inventors: Kumar Nagarajan; Sarathy Rajagopalan, both of Fremont, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/465,425

(22) Filed: Dec. 20, 1999

(51) Int. Cl.$^7$ .................................................. H05K 5/06
(52) U.S. Cl. .................................. 174/52.2; 257/787
(58) Field of Search ........................... 174/52.2, 52.4; 257/787, 737, 738

(56) References Cited

U.S. PATENT DOCUMENTS

| 5,535,101 | * | 7/1996 | Miles et al. ............................ 257/787 |
| 5,889,332 | * | 3/1999 | Lawson et al. ....................... 257/787 |
| 5,942,798 | * | 8/1999 | Chiu ....................................... 257/787 |

* cited by examiner

*Primary Examiner*—Shawn Riley
(74) *Attorney, Agent, or Firm*—Fitch, Even, Tabin & Flannery (57) ABSTRACT

A packaging substrate includes a plurality of bonding pads and a plurality of gutters formed thereon. A die having conductive bumps on an electrically active surface thereof is positioned such that the conductive bumps of the die are electrically connected to the bonding pads of the packaging substrate. An underfill material fills the underfill space between the packaging substrate and the die to complete the structure. The plurality of gutters creates a linear flow front of the underfill material as it flows across the underfill space.

23 Claims, 5 Drawing Sheets

METHOD AND STRUCTURE FOR REDUCING THE INCIDENCE OF VOIDING IN AN UNDERFILL LAYER OF AN ELECTRONIC COMPONENT PACKAGE

TECHNICAL FIELD

The present invention relates to electronic semiconductor packages or assemblies incorporating flip-chip semiconductor devices, and more specifically to methods for underfilling such devices.

BACKGROUND OF THE INVENTION

Flip-chip semiconductor devices permit higher component density and faster access time than conventionally packaged semiconductor devices. These advantages have led to increased usage of such flip-chip devices in the electronic industry. A flip-chip semiconductor device is one in which a semiconductor chip (die) is directly mounted onto a packaging substrate, such as a ceramic or organic packaging substrate. Conductive terminals on an electrically active surface of the semiconductor die, usually in the form of conductive solder bumps, are directly contacted to the wiring patterns on the packaging substrate without the use of wire bonds, tape-automated bonding (TAB), or other like methods. Because the conductive bumps making the connections to the packaging substrate are on the active surface of the die or chip, the die is mounted in a face-down manner, thus the name flip-chip.

One problem in flip-chip mounting is that the coefficient of thermal expansion (CTE) of the die and that of the packaging substrate are frequently mismatched. For example, a silicon die has the CTE of about 3 parts per million per degree Celsius (ppm/° C.) while the CTE of a typical organic substrate is about 16 ppm/° C. and that of typical ceramic packaging substrate is about 6.5 ppm/° C. Since a die operating under normal operating conditions experiences significant variances in temperature, conductive bumps which couple the die to the packaging substrate are subjected to significant stress. This stress leads to thermal fatigue in the bumps and at the interfaces where the bumps contact the conductive bonding pads of a packaging substrate. This stress frequently leads to connection failures. A method used in the art for overcoming the difficulties inherent in the thermal mismatches between the die and substrate is to "underfill" the space between the die and the packaging substrate with an underfill material. This space between die and substrate is referred to as the underfill space. "Underfilling" is intended to fill all the space between the die and packaging substrate, as well as the space between the individual conductive bumps with underfill material (referred to alternatively as underfill or encapsulation material) forming an underfill layer. The effectiveness of the underfill material is achieved by mechanically coupling the die to the packaging substrate decreasing the stress at the die/substrate interface to improve the flip-chip device lifetime.

Although the use of underfill materials improves the reliability of flip-chip devices, the use of such materials create their own problems. One problem is that the process of underfilling sometimes creates voids in the area beneath the die. This occurs when the underfill material does not completely fill the space between the die and packaging substrate. The areas not filled are referred to as voids. When voiding occurs, conductive bumps located in the voided area undergo thermal fatigue as if no underfill material were present. Therefore, reducing the number and size of voids is a matter of serious concern.

Prevention of voids in underfill layer is governed by the properties of underfill materials, for example, rheology, viscosity, and filler content of the material. Additionally, the process of dispensing the material into the underfill space effects voiding as does the physical structure of the space to be underfilled.

Current processes align the die such that the conductive bumps are aligned with the conductive terminals (bonding pads) of the packaging substrate. After die alignment, the conductive bumps (typically formed of solder) are "melted" or reflowed to mechanically and electrically connect the die to the packaging substrate. The underfill space between the die and substrate are then underfilled. Underfill materials are typically injected along one or more of the four sides of the die. Current methods for applying underfill materials typically use a one- or two-sided dispensing process. This means that the underfill material is typically dispensed into the underfill space along only one or two sides of the die. Aided by capillary action, the underfill material propagates beneath the die, ostensibly filling all the space under the die and exiting on remaining sides. Ideally, such one- or two-sided processes push any air which is present in the underfill space out from under the die through the sides where the underfill material is not being applied.

Figure 1:
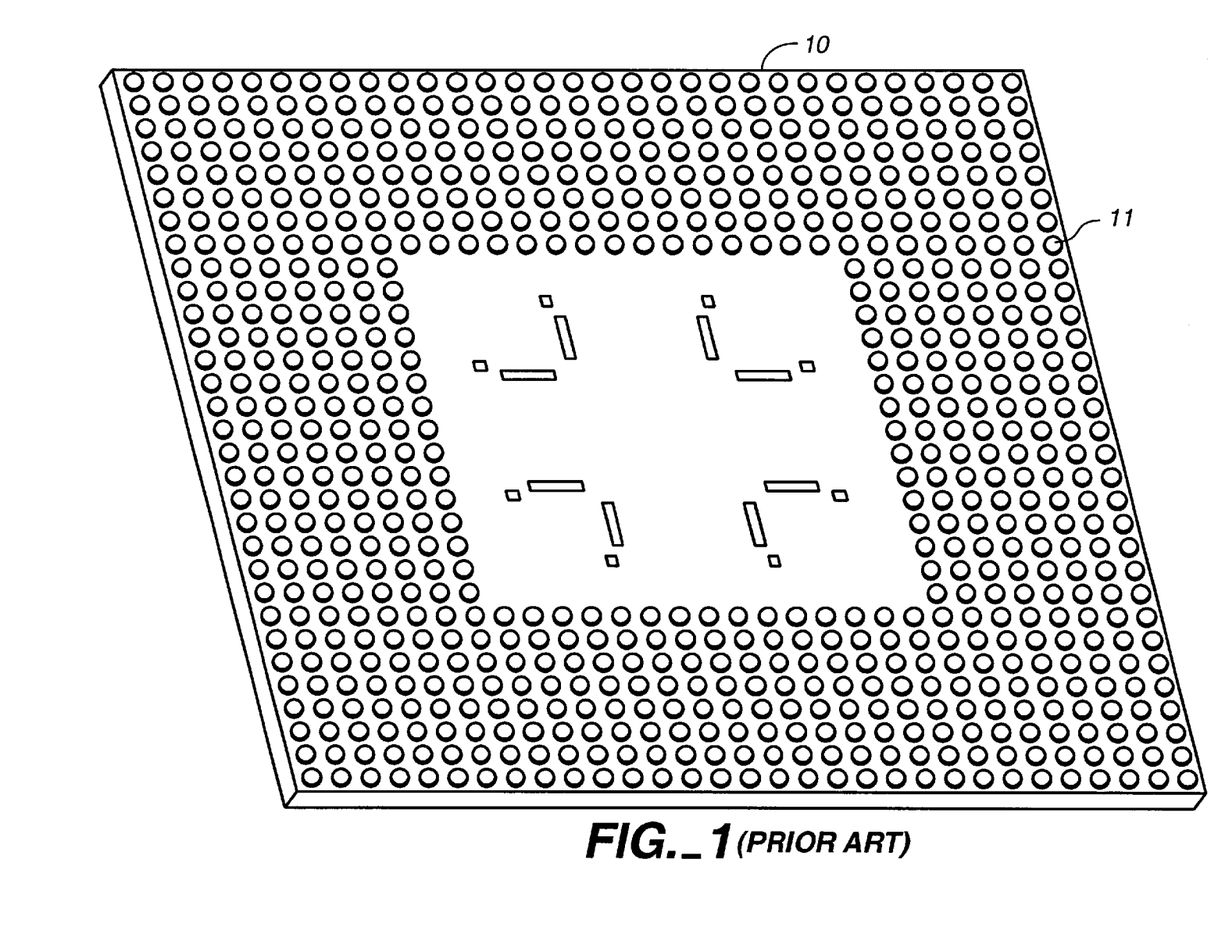
FIG. 1 is a perspective view of a typical semiconductor die with solder balls in place on an active circuit surface.

FIG. 1 is a top perspective view of a typical die 10 as known in the art. The conductive solder bumps 11 are clearly shown. Although the die 10 is shown having conductive solder bumps 11 arranged in a specific configuration, the principles of the present invention may be applied to dies having conductive solder bumps in any configuration. The die 10 is typically flipped over and positioned such that the conductive solder bumps 11 are aligned with bonding pads of a packaging substrate (not shown). The solder bumps are then reflowed to bond them to the bonding pads of a packaging substrate. Then underfilling takes place.

Figure 2:
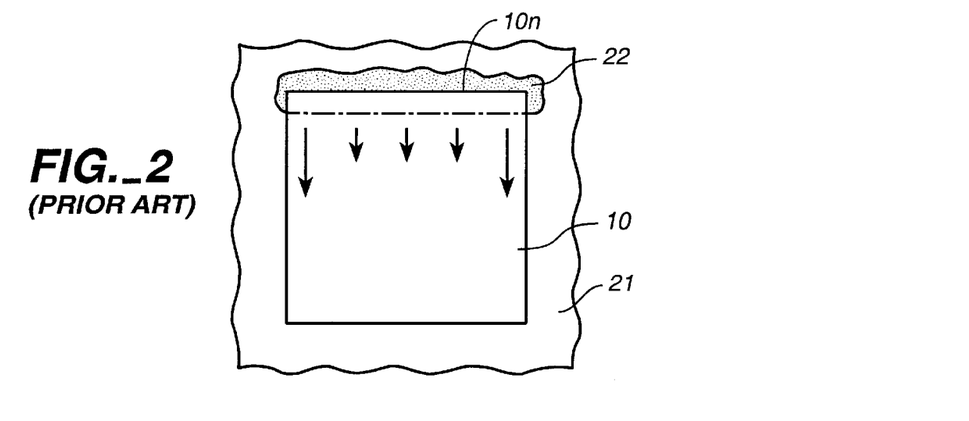
FIGS. 2–4 are top-down views of a semiconductor die and a substrate as underfill material is introduced between the die and substrate along an edge of the die in a known one-sided underfill application process demonstrating the formation of a concave flow front in the underfill material as it propagates into the underfill space between the die and packaging substrate leading to the formation of voids in the underfill material.
Figure 3:
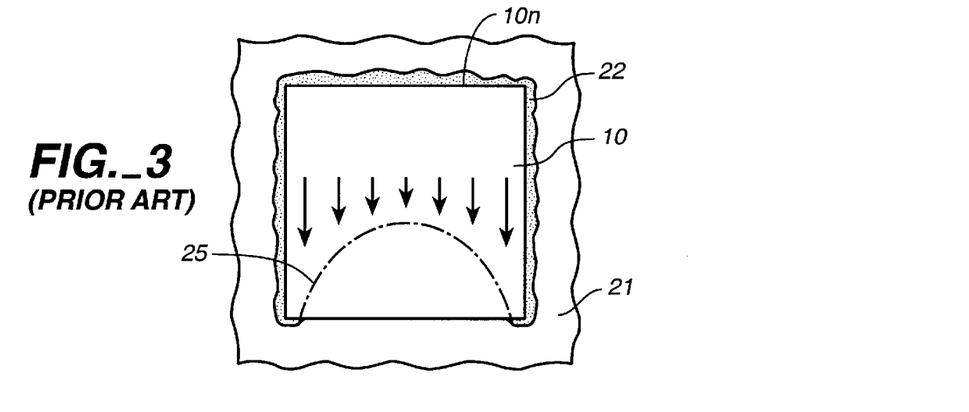
Figure 4:
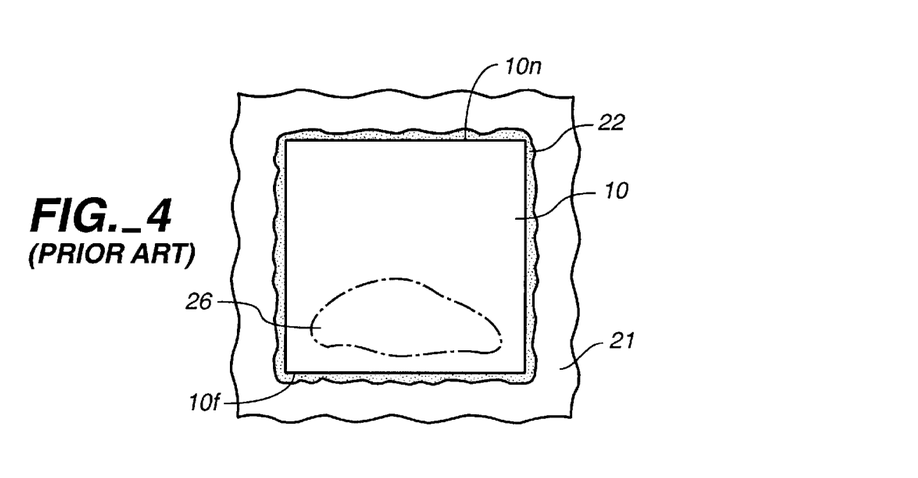

The results of an exemplar one-sided underfill application are shown in FIGS. 2–4 which are simplified top down views of a semiconductor die 10 and a packaging substrate 21, undergoing an underfill process as known in the art. Initially, an underfill material 22 is dispensed along a first (or near) side 10n of the die 10. Over time, the material 22 propagates across the die 10 in the direction indicated by the arrows of FIG. 2. Unfortunately, the propagation pattern of the underfill material 22 across the die 10 is typically nonuniform, with the underfill material flowing across the surface at different rates. In many underfill processes the flow rates of the underfill material is greater along the edges of the die 10 (as indicated by the longer arrows) and slower near the center of the die 10 (indicated by the shorter arrows). This causes a non-linear flow pattern resulting in a so-called "concave flow front" 25 illustrated in FIG. 3. As shown in FIG. 4, such concave flow fronts can lead to the formation of voids as the flow front coalesces around a second (or far) side 10f of the die 10. The air entrapped in region 26 is difficult to remove, resulting in the subsequent formation of voids 26 in the underfill material 22 between the die 10 and the packaging substrate 21.

These flow front problems are magnified in two-sided underfill processes or in die structures where the solder bump density is greater around the outer edges of the die (e.g. FIG. 1) leading to enhanced capillary flow of underfill material around the outer edges of the die 10. Higher flow rates around the edges can also result from the effects of plasma or solvent cleaning of the die and packaging substrate.

One method of reducing the number of voids is to form a so-called "linear flow front" in the underfill material that does not demonstrate the concave geometry presently known in the art. What is needed is a electronic component package which demonstrates a reduced propensity for voiding in the underfill space between the die and packaging substrate. Also needed is a method for reducing the incidence of voids in the underfill space and a method for producing a flow front that does not demonstrate a concave flow front.

SUMMARY OF THE INVENTION

Accordingly, the principles of the present invention contemplate an electronic component structure having a packaging substrate with a top surface and a semiconductor die. The top surface of the packaging substrate including a plurality of bonding pads and a plurality of gutters formed thereon. The die, which includes conductive bumps on an electrically active surface thereof, is aligned and positioned such that the conductive bumps of the die are aligned with and electrically connected to the bonding pads of the packaging substrate. The area between the packaging substrate and the die defines an underfill space which is filled with an underfill material.

Additionally, the principles of the present invention contemplate methods of using a packaging substrate of the present invention to reliably form underfill layers with fewer voids. Such methods comprise the steps of providing a semiconductor die having a near edge and a far edge and including a plurality of conductive bumps formed on an active circuit surface of the die. Also provided is a packaging substrate having a top surface wherein said top surface includes a plurality of bonding pads formed thereon and a plurality of gutters formed thereon. A mounting step for aligning and positioning said die onto the packaging substrate such that the plurality of conductive bumps are aligned and contacted to the bonding pads of the packaging substrate, and wherein upon said mounting, an underfill space is formed between said die and said packaging substrate. This is followed by applying an underfill material to an edge of the die. After applying the underfill material the underfill material propagates into the underfill space having a flow front, the gutters facilitating a linear flow front in said underfill material until said underfill material substantially fills said underfill space thereby reducing the incidence of voiding in the underfill layer.

Other features of the present invention are disclosed or made apparent in the section entitled "DETAILED DESCRIPTION OF THE INVENTION".

BRIEF DESCRIPTION OF THE DRAWINGS

For a fuller understanding of the present invention, reference is made to the accompanying drawings in the following Detailed Description of the Invention. Reference numbers and letters refer to the same or equivalent parts of the invention throughout the several figures of the drawings. In the drawings.

DETAILED DESCRIPTION OF THE INVENTION

The principles of the present invention contemplate an improved electronic component packages including a packaging substrate featuring gutters which reduce the incidence of voiding in underfill layers. Additionally, the present invention comprises an improved method of forming electronic component packages and most particularly, an improved method of forming an underfill layer in such packages.

The present invention contemplates an improved packaging substrate as well as methods for using said substrate to form high quality underfill layers. As contemplated by the present invention, the functionality or type of semiconductor die 10 used is unimportant. For example, the die may be a memory, a microprocessor, an analog device, an application specific integrated circuit device, or similar devices. Additionally, the particular shape of the semiconductor die is not important for the purpose of practicing the invention. Similarly, the manner in which the conductive bumps 11 are formed, and the materials from which they are formed, are not restricted by this invention. In a preferred form of the present invention, the conductive bumps 11 are formed as solder bumps. Conventional methods of forming the bumps maybe used to form the conductive bumps. One method is to selectively deposit a metal on the active surface of the die (for instance using deposition through a shadow mask), followed by a reflow process which establishes the final bump composition and a generally spherical shape. In the industry, this method is sometimes referred to as C4 (controlled collapsed chip connection) bump processing.

Figure 5:
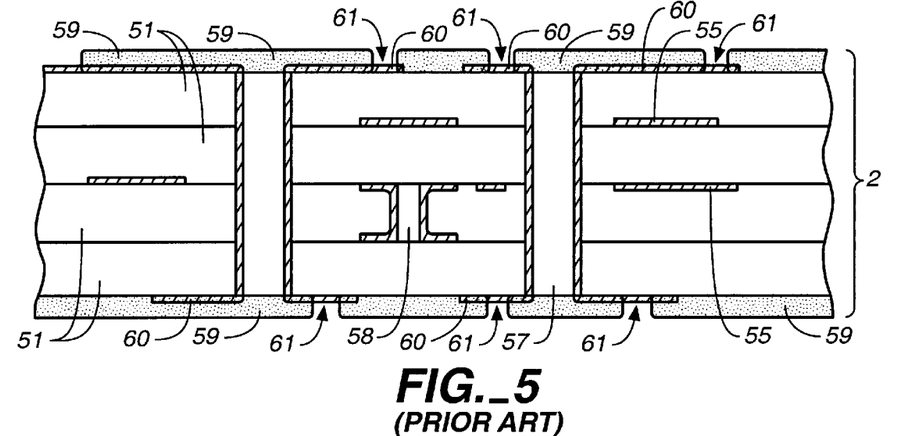
FIG. 5 is a cross section view of a typical packaging substrate as presently known in the art.

FIG. 5 shows an example of a conventional packaging substrate 21, which typically includes a plurality of dielectric or insulating layers 51 and a plurality of internal conductive layers 55 which are laminated or co-fired between the various insulating layers 51. In two specific embodiments of the present invention, the packaging substrate 50 can be in the form of an organic substrate or a ceramic substrate. In an organic substrate, the bulk material of the dielectric or insulating layers, is typically a resin, such as bisimaleimide thiazine (BT) resin. In the case of organic substrates, the internal conductive layers 55 are typically formed of a copper material which has been laminated on an insulating layer 51, and subsequently patterned and etched to form a desired conductive pattern. Multiple dielectric layers having conductive layers laminated thereon are then pressed together to form a composite, multi-layer packaging substrate, such as that illustrated in FIG. 5. In the case of a ceramic substrate, the dielectric material used to form insulating layers 51, is typically some type of ceramic material such as alumina, or glass ceramic. The internal conductive layers 55, of a ceramic packaging substrate are, for example, copper, tungsten, or molybdenum, formed, for example, by screen printing metal paste in a desired pattern. As with organic substrate, individual dielectric layers are laminated together to form a multi-layer ceramic substrate. A subsequent firing operation at about 800° C.–1600° C. is performed to densify the ceramic and make the metal pastes more conductive.

Both organic and ceramic substrates typically include a variety of vias which electrically interconnect the various conductive layers in and through the substrate. As illustrated in FIG. 5 a substrate 21 includes through vias 57 and blind vias 58. The through vias 57 are conductive vias which extend completely through the entire cross-section of a substrate (i.e. extending from the top surface of the substrate through to the bottom surface of the substrate). Blind vias 58, only interconnect the various internal conductive layers of the substrate. Blind vias 58 are so named because they cannot be discerned from visual inspections of a finished substrate. The packaging substrate 21 also includes external conductive layers 60 which exist on the top and bottom surfaces of the substrate as illustrated in FIG. 5. External conductive layers 60 are typically patterned using processing techniques similar to those used to define the internal conductive layers 55. The external conductive layers 60, which are formed on top of the packaging substrate 21 are used for routing electrical signals from a semiconductor die (not shown) to appropriate conductive vias and conductive layers within the substrate and eventually to the external conductive layers 60 on the bottom of the packaging substrate. The external conductive layers 60 are typically patterned into a plurality of conductive traces and bonding pads. The bonding pads on the top surface of the substrate correspond to the bump configuration of a die which is to be attached to the substrate. The pads on the bottom surface of the substrate correspond to the configuration of a circuit board onto which the substrate 21 is to be attached. As illustrated in FIG. 5, the packaging substrate 21 includes a solder mask 59 on the top and bottom surfaces of the packaging substrate 21, selectively covering external conductive layers 60. Solder masks 59 are typically included in organic packaging substrates, but are not typically present in ceramic substrates. On the top surface, the solder mask 59 includes openings 61 for receiving the conductive bumps of a semiconductor die. Since the solder mask 59 is typically made of insulating material, portions of the packaging substrate 21 which make electrical contact to the die, must be exposed. Typically, the mask is patterned to expose individual bonding pads 61 on the top external conductive layer 60 where the bumps of the die will be connected. On the bottom surface, the solder mask 59 is patterned to expose those portions of the external conductive layer 60 where terminals will be connected. As illustrated the solder mask 59 includes a plurality of openings 61 for this purpose. Alternatively, it is known to construct bonding pads having a raised structure wherein the pads are raised slightly above a topmost dielectric or insulating layer of a packaging substrate. As thus far described, the packaging substrate 21 is formed in accordance with conventional substrate manufacturing techniques. The materials of the solder mask 59, insulating layers 51, internal conductive layers 55, and external conductive layers 60, the manner in which the vias 57, 58 are formed, and the manner in which conductive layers are patterned, are all known to those having ordinary skill in the art of substrate manufacturing. The present invention builds upon an otherwise conventional packaging substrate to facilitate the process of underfilling a flip-chip semiconductor die. It should be noted that the principles of the present invention specifically contemplate the usage of the present invention in other types of packaging substrates, especially those which do not require a solder mask.

Figure 6:
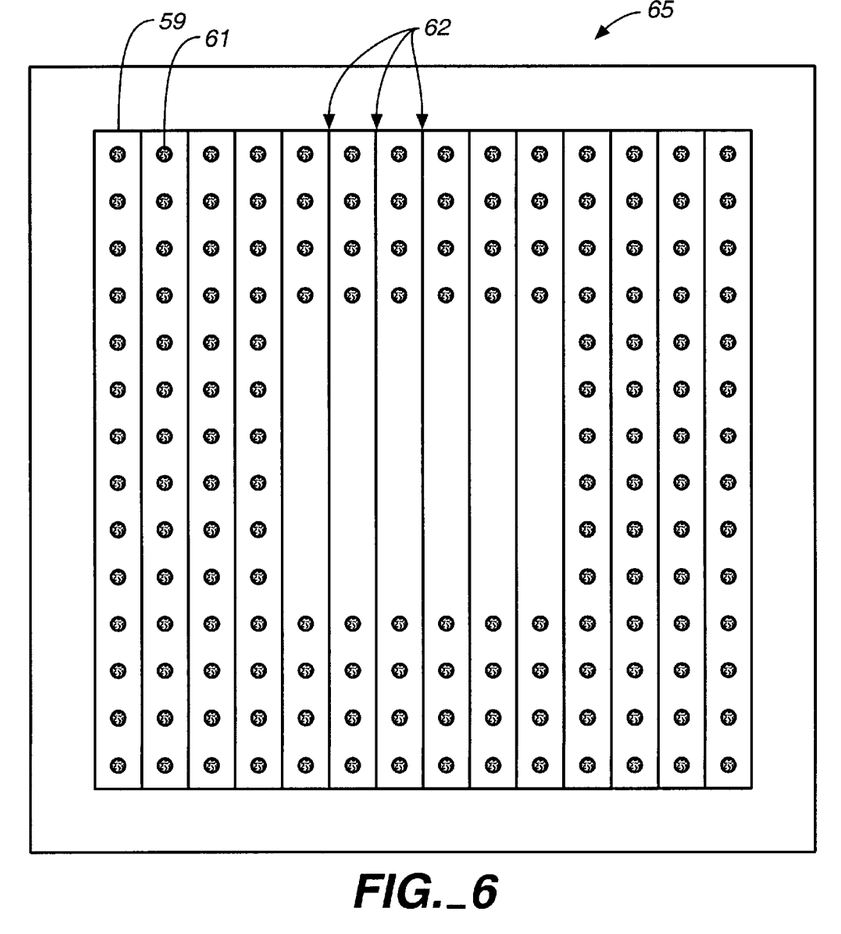
FIG. 6 is a plan view of a packaging substrate constructed in accordance with the principles of the present invention.
Figure 7A:
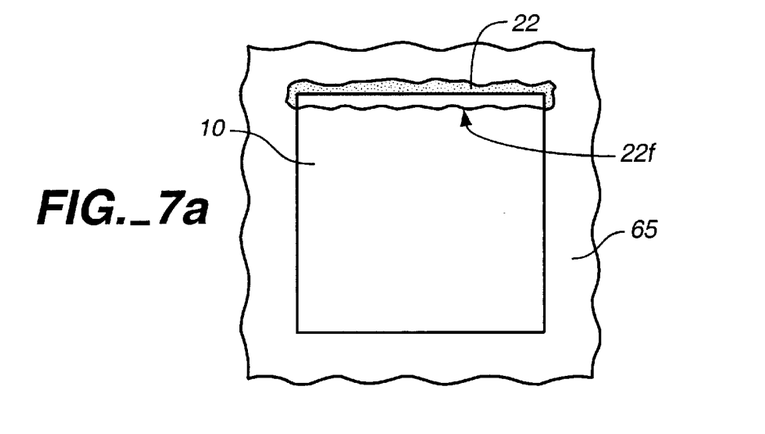
FIGS. 7a, 7b, and 7c are plan views of a packaging substrate and a die as an applied underfill material propagates across an underfill space between the die and packaging substrate in accordance with the principles of the present invention.
Figure 7B:
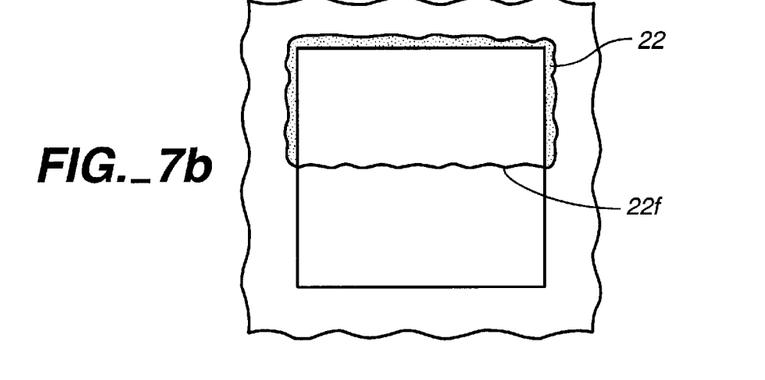
Figure 7C:
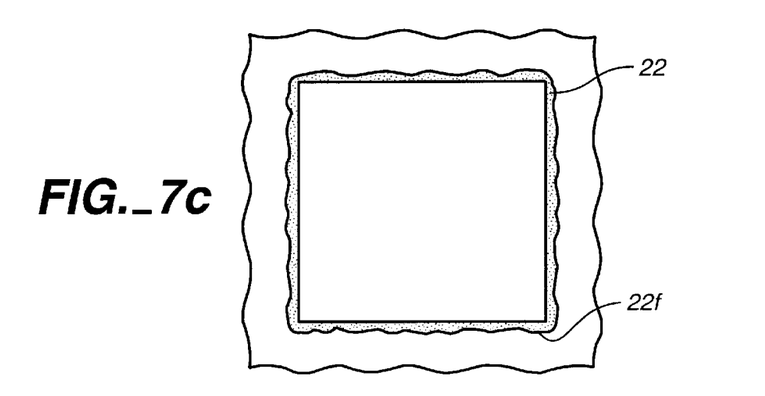

FIG. 6 is a plan view of a packaging substrate 65 constructed in accordance with the principles of the present invention. In most respects, the packaging substrate 65 resembles a conventional substrate. The packaging substrate 65 may include a solder mask 59 with bonding pads 61 for contacting the conductive bumps of a chip (not shown). It is also contemplated by the inventors that the packaging substrate of the present invention does not include a solder mask. Presently, typical packaging substrates 21 have bonding pads 61 that are about 8–10 mils (thousandths of an inch) apart, with separations of as small as 2 mils being not uncommon. The present invention calls for the formation of small gutters 62 on a top surface of a packaging substrate 62. Each of these gutters 62 lies between the bonding pads 61 of the packaging substrate 65, the idea being that the gutters 62 do not contact the bonding pads 61. A typical gutter 62 lies approximately equidistant from adjacent bonding pads 61. The purpose of the gutters 62 is to achieve a more uniform flow rate of underfill material across the entire die surface during the application of an underfill material during a the formation of an underfill layer. For example, in FIGS. 7a–7c, a more uniform flow rate is created across the entire surface of the die 10 resulting in a more uniform or "linear" flow front 22f of the underfill material as it propagates across an underfill space during the process of forming an underfill layer. Referring again to FIG. 6, this linear flow front 22f is accomplished with gutters 62 that are formed substantially parallel to the desired direction of flow of the underfill material in the top surface of a packaging substrate 65.

Figure 8:
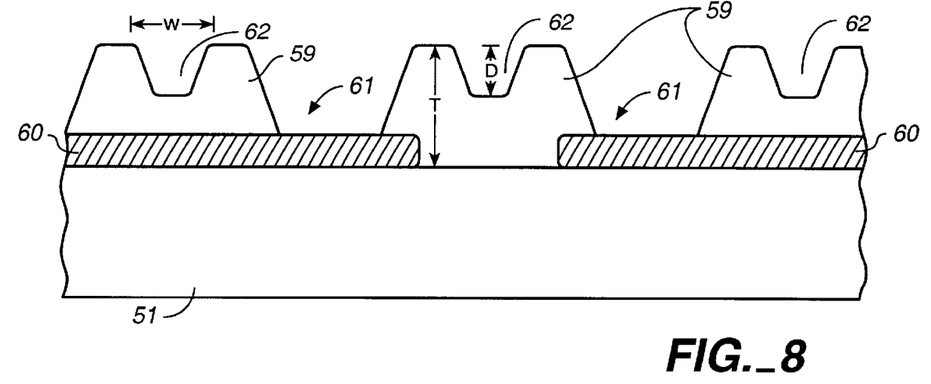
FIG. 8 is a cross section view of a packaging substrate having gutters formed in a solder mask in accordance with an embodiment of the present invention.

FIG. 8 is a magnified cross-section view of the topmost region of FIG. 6, illustrating some features of the present invention. A solder mask 59 is formed over the conducting layer 60. A typical solder mask having a thickness T of about 30μ. The present invention includes gutters 62 which are positioned between adjacent bonding pads 61. In the pictured embodiment the gutters 62 are formed in the solder mask 59. Although it is expressly contemplated that the gutters may be formed in any top surface of a packaging substrate. The gutters 62 must be deep enough and wide enough to initiate a non-concave (or linear) flow front to develop in the underfill material during application of underfill material. A preferred embodiment uses gutters 62 having a width W in the range of about 15μ–25μ and a depth D in the range of about 15μ–20μ. A preferred gutter dimension being about 15μ by 15μ. Although the forgoing embodiment is formed having certain preferred dimensions, the invention is in no way limited to this specific embodiment. Gutters having other spacings and dimensions are expressly contemplated by the inventors as falling with in the scope of this invention.

A packaging substrate as described in the present invention can be formed by providing a conventional packaging substrate, then forming a plurality of gutters in the top surface. A laser may be used to scribe a plurality of substantially parallel grooves in the top surface of a solder mask to produce gutters. The grooves being located between the bonding pads of the packaging substrate. Also, satisfactory gutters may be etched in a solder mask using any of the etch techniques used in the semiconductor process industry (e.g. chemical etching, plasma etching, reactive ion etching, and other techniques known to those having ordinary skill in the art). Additionally, where a solder mask is not present in an organic packaging substrate the grooves may be etched (or laser scribed) directly onto a top layer of a packaging substrate. For example, a dielectric or insulating layer of the packaging substrate. Further, in the case of ceramic packaging substrates, the grooves may also be laser scribed to produce a plurality of gutters. Also, gutters may be mechanically cut into both organic and ceramic substrates using a high precision saw.

Figure 9:
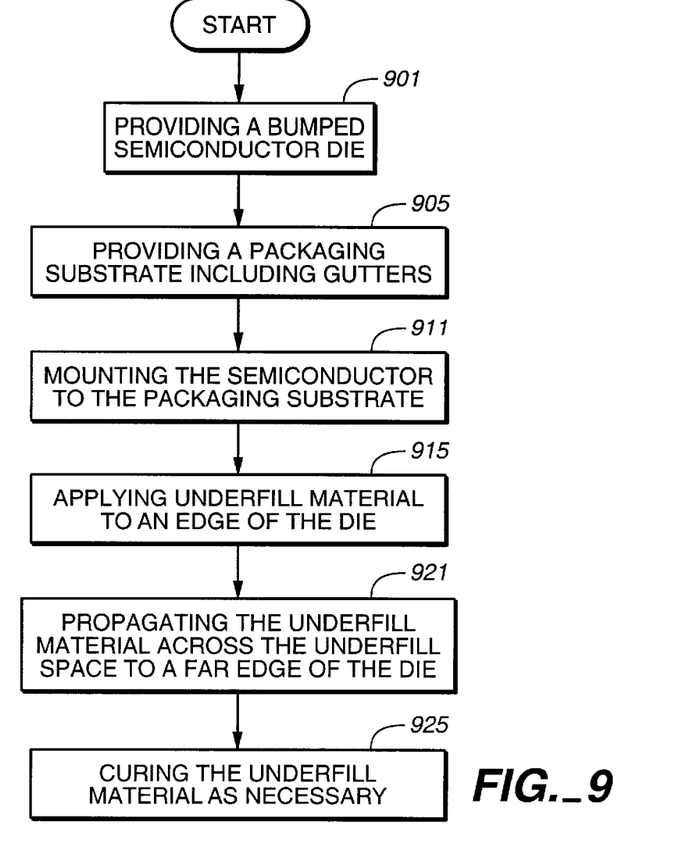
FIG. 9 is a is a flowchart showing a method of constructing a device of the present invention in accordance with the principles of the present invention.

FIG. 9 illustrates a representative process flow for underfilling a semiconductor die in accordance with the present invention. This process of the present invention provides for underfilling a flip-chip semiconductor device such that a minimum of voids occur in the underfill layer. Void formation is reduced by the process of the present invention due to an improved packaging substrate which results in a substantially uniform flow rate of the underfill material during the application process leading to a substantially linear flow front in the underfill material during its application.

The process begins by providing a semiconductor die having an active surface and a plurality of edges. The active surface including a plurality of bumps formed thereon (Step 901).

The process continues by providing a packaging substrate having a top surface, said top surface including a plurality of bonding pads corresponding to the number of bumps of said die and including a plurality of gutters for directing the flow of an underfill material (Step 905).

The semiconductor die is mounted on the top surface of the packaging substrate such that the plurality of bumps on the die surface are aligned and electrically contacted to the bonding pads of the packaging substrate. Such aligning is typically accomplished using ordinary techniques known to those having skill in the art. For example, utilizing automated vision alignment using image recognition. The electrical contact typically being achieved by subjecting the conductive bumps to a reflow process as is known to those having ordinary skill in the art. Wherein upon said mounting, an underfill space is formed between the active die surface and the top surface of the packaging substrate. (Step 911).

Applying an underfill material (Step 915). For example, a polymeric epoxy, as is readily available from Dexter Corp. of Windsor Locks, Conn. A typical method of application being, dispensing along a first or near edge of the die using an automated dispensing tool which dispenses precise quantities of underfill material.

After applying the underfill material, the underfill material flows into said underfill space toward a second or far edge having a flow front, the gutters serving to facilitate a linear flow front until said underfill material reaches said far edge. In a typical example using a ½ inch die, the process takes about 60 seconds. Typically, the flow front is nearly transverse to the gutters.(Step 921).

A curing step is used to cure the underfill material (Step 925).

While the invention herein disclosed has been described by means of specific embodiments and applications thereof, other modifications, variations, and arrangements of the present invention may be made in accordance with the above teachings other than as specifically described to practice the invention within the spirit and scope defined by the following claims.

What is claimed is:

1. An electronic component structure comprising:
    a packaging substrate including a plurality of bonding pads on a surface thereof;
    a plurality of gutters formed on the surface of the packaging substrate between adjacent bonding pads;
    a semiconductor die having conductive bumps on an electrically active surface thereof wherein the semiconductor die is aligned and positioned such that the conductive bumps are aligned with and electrically connected to the bonding pads of the packaging substrate;
    an underfill space defined between the surface of the packaging substrate and the electrically active surface of the semiconductor die; and
    an underfill material filling the underfill space wherein the plurality of gutters creates a substantially linear flow front of the underfill material as it propagates across the underfill space during filling.

2. An electronic component structure as in claim 1 wherein said packaging substrate comprises a ceramic packaging substrate.

3. An electronic component structure as in claim 1 wherein said packaging substrate comprises an organic packaging substrate.

4. An electronic component structure as in claim 1 wherein said plurality of gutters includes a plurality of substantially parallel gutters.

5. An electronic component structure as in claim 1 wherein said plurality of gutters are formed having a depth and a width and wherein said width is in the range of about $15\mu$ (micron) to about $25\mu$ and wherein said depth is in the range of about $15\mu$ to about $20\mu$.

6. An electronic component structure as in claim 5 wherein said plurality of gutters are formed having said depth being about $15\mu$ and said width being about $15\mu$.

7. An electronic component structure as in claim 3 wherein the top surface of said organic packaging substrate further includes a layer of solder mask material and wherein said plurality of gutters are formed in said layer of solder mask material.

8. An electronic component structure as in claim 7 wherein said layer of solder mask material has a thickness and wherein said plurality of gutters are formed having a depth less than the thickness of said solder mask.

9. An electronic component structure as in claim 3 wherein the top surface of said organic packaging substrate further includes a layer of electrically insulating material and wherein said plurality of gutters are formed in said layer of electrically insulating material.

10. An electronic component structure as in claim 2 wherein the top surface of said ceramic packaging substrate further includes a layer of electrically insulating material and wherein said plurality of gutters are formed in said layer of electrically insulating material.

11. A method for forming an underfill layer in an electronic component package comprising the steps of:
    a) providing a semiconductor die including a plurality of conductive bumps formed on an active surface thereof;
    b) providing a packaging substrate having a plurality of bonding pads on a surface thereof;
    c) forming a plurality of gutters on the surface of the packaging substrate between adjacent bonding pads;
    d) mounting the semiconductor die on the surface of the packaging substrate wherein an underfill space is formed between the semiconductor die and the packaging substrate; and
    e) filling the underfill space with an underfill material wherein the plurality of gutters creates a substantially linear flow front of the underfill material flowing into the underfill space.

12. A method as in claim 11 wherein step c) includes forming a plurality of gutters having a depth and a width and wherein the width is in the range of about 15μ to about 25μ and wherein the depth is in the range of about 15μ to about 20μ.

13. A method as in claim 12 wherein step c) includes forming a plurality of gutters wherein the depth of the gutters is about 15μ and the width of the gutters is about 15μ.

14. A method as in claim 11 wherein step c) includes forming a plurality of substantially parallel gutters.

15. A method as in claim 14 wherein step e) includes filling the underfill space such that the flow front is substantially transverse to the plurality of gutters.

16. A method as in claim 11 wherein step b) includes providing a packaging substrate including a solder mask on the surface of the packaging substrate and wherein step c) includes forming the plurality of gutters in the solder mask.

17. A packaging substrate comprising:
   at least one layer of dielectric material, each of said at least one layer of dielectric material being formed over other layers of dielectric material;
   said at least one layer of dielectric material including a top layer formed thereon;
   said top layer including a plurality of bonding pads formed on a top surface thereof; and
   said top layer including a plurality of gutters formed thereon.

18. A packaging substrate as in claim 17 wherein said at least one layer of dielectric material is comprised of a ceramic material.

19. A packaging substrate as in claim 17 wherein said at least one layer of dielectric material is comprised of a resin material.

20. A packaging substrate as in claim 17 wherein said top surface including a plurality of gutters formed thereon includes having a plurality of substantially parallel gutters.

21. A packaging substrate as in claim 17 wherein said plurality of gutters are formed having a depth and a width and wherein said width is in the range of about 15μ to about 25μ and wherein said depth is in the range of about 15μ to about 20μ.

22. A packaging substrate as in claim 19 wherein said top layer formed thereon includes a top layer formed of solder mask material and wherein said plurality of gutters are formed in said layer of solder mask material.

23. A packaging substrate as in claim 22 wherein said top layer of solder mask material has a thickness and wherein said plurality of gutters are formed having a depth less than the thickness of said solder mask material.

* * * * *